(12) United States Patent
Yeo et al.

(10) Patent No.: US 9,291,843 B2
(45) Date of Patent: Mar. 22, 2016

(54) DISPLAY APPARATUS

(71) Applicant: SAMSUNG DISPLAY CO., LTD., Yongin, Gyeonggi-Do (KR)

(72) Inventors: Gilhwan Yeo, Hwaseong-si (KR); Bumsoo Kam, Yongin-si (KR); DaeJin Park, Incheon (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 93 days.

(21) Appl. No.: 14/301,365

(22) Filed: Jun. 11, 2014

(65) Prior Publication Data

US 2015/0109544 A1    Apr. 23, 2015

(30) Foreign Application Priority Data

Oct. 18, 2013  (KR) .......................... 10-2013-0124697

(51) Int. Cl.
| | |
|---|---|
| *G02F 1/1333* | (2006.01) |
| *H01L 27/32* | (2006.01) |
| *H01L 51/52* | (2006.01) |
| *G06F 1/16* | (2006.01) |

(52) U.S. Cl.
CPC ...... *G02F 1/133305* (2013.01); *H01L 27/3225* (2013.01); *H01L 27/3297* (2013.01); *G02F 2001/133394* (2013.01); *G06F 1/1601* (2013.01); *H01L 51/524* (2013.01); *H01L 2251/5338* (2013.01)

(58) Field of Classification Search
CPC ................................. G02F 1/133388
See application file for complete search history.

(56) References Cited

U.S. PATENT DOCUMENTS

| | | | |
|---|---|---|---|
| 7,050,835 B2 | 5/2006 | Hack et al. | |
| 7,710,402 B2 | 5/2010 | Takenaka et al. | |
| 8,325,159 B2 | 12/2012 | Kent et al. | |
| 9,013,433 B2 * | 4/2015 | Kang et al. | 345/173 |
| 2010/0182738 A1 | 7/2010 | Visser et al. | |
| 2012/0264489 A1 | 10/2012 | Choi et al. | |
| 2014/0368782 A1 * | 12/2014 | Kim et al. | 349/153 |

FOREIGN PATENT DOCUMENTS

| | | |
|---|---|---|
| JP | 2006-174506 A | 6/2006 |
| JP | 2006-287982 A | 10/2006 |
| JP | 2010-152671 A | 7/2010 |
| JP | 2012-242210 A | 12/2012 |
| KR | 10-2000-0015821 A | 3/2000 |
| KR | 10-2007-0094335 A | 9/2007 |
| KR | 10-2009-0084779 A | 8/2009 |
| KR | 10-2011-0006787 A | 1/2011 |
| KR | 10-2012-0093665 A | 8/2012 |

* cited by examiner

*Primary Examiner* — Timothy L Rude
(74) *Attorney, Agent, or Firm* — Lee & Morse, P.C.

(57) ABSTRACT

A display apparatus includes a flexible display panel including a plurality of non-bending areas and a bending area between the non-bending areas, the flexible display panel being foldable along the bending area, a frame part in the non-bending areas of the flexible display panel and supporting the non-bending areas to prevent the non-bending areas from being bent, and a sensor in the bending area to sense folding of the flexible display panel.

20 Claims, 11 Drawing Sheets

DISPLAY APPARATUS

CROSS-REFERENCE TO RELATED APPLICATION

Korean Patent Application No. 10-2013-0124697, filed on Oct. 18, 2013, in the Korean Intellectual Property Office, and entitled: "Display Apparatus," is incorporated by reference herein in its entirety.

BACKGROUND

1. Field

Embodiments relate to a foldable display apparatus.

2. Description of the Related Art

A display apparatus is used to display an image in various electronic devices, such as television sets, monitors, notebooks, mobile phones, etc.

SUMMARY

Embodiments are directed to a display apparatus, comprising a flexible display panel including a plurality of non-bending areas and a bending area between the non-bending areas, the flexible display panel being foldable along the bending area, a frame part in the non-bending areas of the flexible display panel and supporting the non-bending areas to prevent the non-bending areas from being bent, and a sensor in the bending area to sense folding of the flexible display panel.

The flexible display panel may further include a display area in which an image is displayed and a non-display area surrounding the display area. The frame part may be located along the non-display area.

The sensor may be on an upper surface and a rear surface of the flexible display panel.

The flexible display panel may further include an array substrate and an opposite substrate facing the array substrate. The sensor may be on an upper surface and on a rear surface of the array substrate.

The flexible display panel may further include a cover film that covers the bending area of the non-display area.

An outer surface of the cover film may have an embossed structure.

The non-display area may include a line area in which a signal line is located and a dead area in which the signal lines is not located. The sensor is located inn the dead area.

The signal line may further include a plurality of data lines and a plurality of fan-out parts in the line area, the fan-out parts being connected to the data lines. The sensor may be between the fan-out parts.

The flexible display panel may further include an insulating layer on the line area and between the sensor and the signal line.

The flexible display panel may further include a black matrix area defined in the non-display area and surrounding the display area and a black matrix in the black matrix area, the sensor overlapping the black matrix.

The sensor may include a serial sensor that includes a plurality of sensors connected to each other in series.

The serial sensor may be provided as a plural number of serial sensors. The serial sensors may be connected to each other in parallel.

The flexible display panel may have a rectangular shape and may include first, second, third, and fourth corners. The bending area may include first, second, third, and fourth bending areas that are inclined to a lengthwise direction and a widthwise direction of the flexible display panel and that extend in different directions from each other. The first bending area may be located at the first corner such that the flexible display panel is foldable along the first bending area at the first corner. The second bending area may be located at the second corner such that the flexible display panel is foldable along the second bending area at the second corner. The third bending area may be located at the third corner such that the flexible display panel is foldable along the third bending area at the third corner. The fourth bending area may be located at the fourth corner such that the flexible display panel is foldable along the fourth bending area at the fourth corner.

The bending area may extend in a lengthwise direction of the flexible display panel such that the flexible display panel is foldable in a widthwise direction of the flexible display panel.

The bending area may extend in a widthwise direction of the flexible display panel such that the flexible display panel is foldable in a lengthwise direction of the flexible display panel.

The flexible display panel may further include an array substrate and an opposite substrate facing the array substrate. The non-display area may include a pad area obtained by extending the array substrate in one direction thereof more than the opposite substrate extends in the one direction. The array substrate may not overlap the opposite substrate in the pad area. The sensor may be disposed in the pad area.

The array substrate may include a sensor pad at an end portion of the pad area. The sensor may be electrically connected to the sensor pad.

The display apparatus may further include a flexible printed circuit board on the sensor pad, and an anisotropic conductive film between the sensor pad and the flexible printed circuit board. The sensor pad may be connected to the flexible printed circuit board through the anisotropic conductive film.

The sensor may be a piezoelectric device.

The flexible display panel may be a liquid crystal display panel or an organic light emitting display panel.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
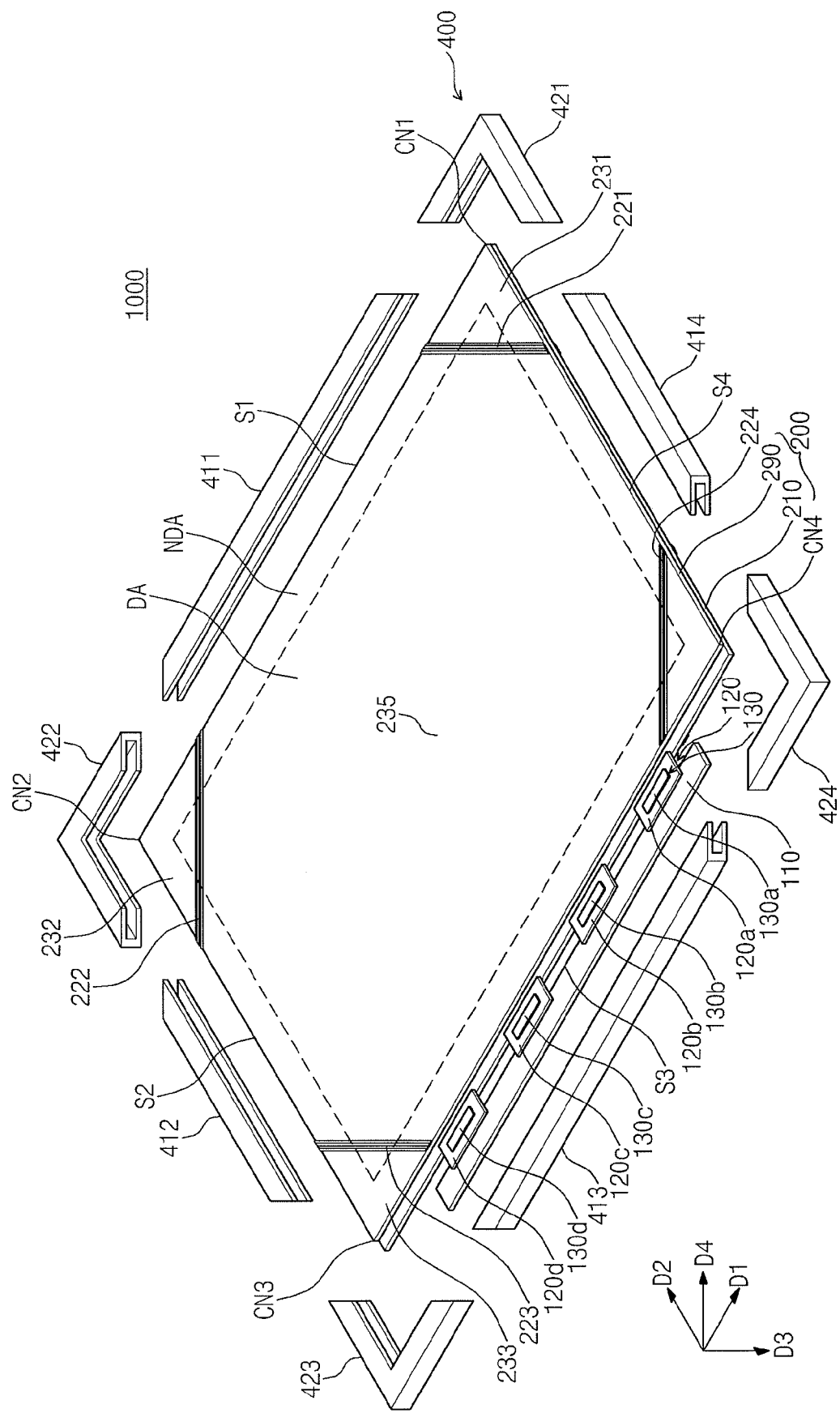
FIG. 1 illustrates a perspective view showing a display apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms, "a", "an" and "the" are intended to include the plural forms as well, unless the context clearly indicates otherwise. It will be further understood that the terms "includes" and/or "including", when used in this specification, specify the presence of stated features, elements, and/or components, but do not preclude the presence or addition of one or more other features, elements, components, and/or groups thereof.

Unless otherwise defined, all terms (including technical and scientific terms) used herein have the same meaning as commonly understood by one of skill in the relevant art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be explained in detail with reference to the accompanying drawings.

Figure 2:
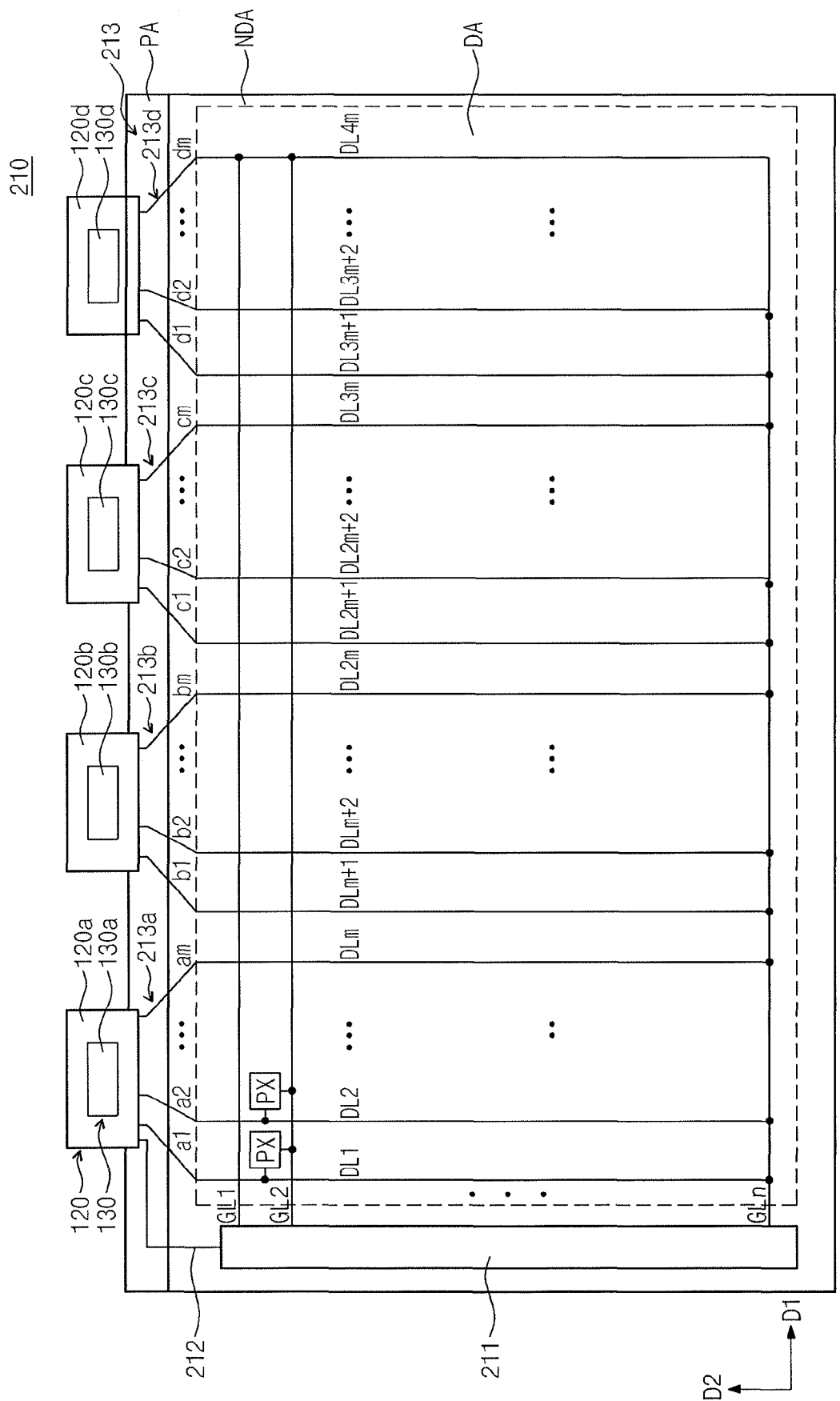
FIG. 2 illustrates a plan view showing an array substrate shown in FIG. 1.

FIG. 1 illustrates a perspective view showing a display apparatus according to an exemplary embodiment and FIG. 2 illustrates a plan view showing an array substrate shown in FIG. 1.

Referring to FIG. 1, a display apparatus 1000 may include a printed circuit board 110, a flexible printed circuit board 120, a driving chip 130, a flexible display panel 200, and a frame part 400.

The printed circuit board 110 may apply a data driving signal and a gate driving signal to the flexible display panel 200, and the flexible printed circuit board 120 connects the printed circuit board 110 to the flexible display panel 200.

The flexible printed circuit board 120 may be a tape carrier package (TCP) or a chip on film (COF), on which the driving chip 130 is mounted. The flexible printed circuit board 120 may include first to fourth flexible printed circuit boards 120a to 120d arranged in a first direction D1 and spaced apart from each other.

The flexible display panel 200 may display an image and may include a display area DA in which the image is displayed and a non-display area NDA surrounding the display area DA.

The flexible display panel 200 may be one of various display panel types, such as an organic light emitting display panel, a liquid crystal display panel, a plasma display panel, an electrophoretic display panel, an electrowetting display panel, etc.

The flexible display panel 200 may include an array substrate 210, an opposite substrate 290, and a light control layer. The opposite substrate 290 may face the array substrate 210 while being coupled to the array substrate 210, and the light control layer may be interposed between the array substrate 210 and the opposite substrate 290. As an example, the light control layer may be a liquid crystal layer.

Referring to FIG. 2, the array substrate 210 may include a gate driver 211, a plurality of gate lines GL1 to GLn, a plurality of data lines DL1 to DL4m, a plurality of pixels PX, and a fan-out part 213.

The gate driver 211 may be disposed in the non-display area NDA of the array substrate 210 and may receive the gate driving signal from the printed circuit board 110. The gate driver 211 may be electrically connected to one end of the gate lines GL1 to GLn to sequentially apply a gate signal to the gate lines GL1 to GLn. The gate driver 211 may be electrically connected to the flexible printed circuit board 120 by a gate driving line 212 disposed in the non-display area NDA. The gate driver 211 may be formed on the array substrate 210 through a thin film process.

The gate lines GL1 to GLn may be arranged in the display area DA of the array substrate 210 and may transmit the gate signal to the pixels PX. The gate lines GL1 to GLn may extend in the first direction D1 and may be arranged in a second direction D2 substantially perpendicular to the first direction D1. The gate lines GL1 to GLn may be spaced apart from each other at regular intervals and each of the gate lines GL1 to GLn may be electrically connected to corresponding pixels of the pixels PX.

The data lines DL1 to DL4m may be arranged in the display area DA and may be electrically insulated from the gate lines GL1 to GLn to transmit a data signal to the pixels PX. The data lines DL1 to DL4m may extend in the second direction D2 and may be arranged in the first direction D1 to be spaced apart from each other at regular intervals. Each of the data lines DL1 to DL4m may be electrically connected to corresponding pixels of the pixels PX.

The pixels PX may be arranged in the display area DA in a matrix form and may generate the image corresponding to the data signal in response to the gate signal.

The fan-out part 213 may be disposed in the non-display area NDA of the array substrate 210 and may be connected to the flexible printed circuit board 120 to receive the data signal. The fan-out part 213 may apply the received data signal to the data lines DL1 to DL4m. In the present exemplary embodiment, the fan-out part 213 may include first to fourth fan-out parts 213a to 213d corresponding to the first to fourth flexible printed circuit boards 120a to 120d in a one-to-one correspondence. The first to fourth fan-out parts 213a to 213d may be arranged in the first direction D1 and may be spaced apart from each other by a predetermined distance.

The first fan-out part 213a may include a plurality of first fan-out lines a1 to am. One end of the first fan-out lines a1 to am may be electrically connected to the first flexible printed circuit board 120a and the other end of the first fan-out lines a1 to am may be electrically connected to the data lines DL1 to DLm, respectively.

Similarly, the second to fourth fan-out parts 213b to 213d may include second to fourth fan-out lines b1 to bm, c1 to cm, and d1 to dm, respectively. One end of the second fan-out line b1 to bm may be electrically connected to the second flexible printed circuit board 120b and the other end of the second fan-out line b1 to bm may be electrically connected to the data lines DLm+1 to DL2m, respectively. One end of the third fan-out line c1 to cm may be electrically connected to the third flexible printed circuit board 120c and the other end of the third fan-out line c1 to cm may be electrically connected to the data lines DL2m+1 to DL3m, respectively. One end of the fourth fan-out line d1 to dm may be electrically connected to the fourth flexible printed circuit board 120d and the other end of the fourth fan-out line d1 to dm may be electrically connected to the data lines DL3m+1 to DL4m, respectively.

The flexible display panel 200 may include a black matrix. The black matrix may be defined in the non-display area NDA and may be disposed in a black matrix area surrounding the display area DA. The black matrix may be disposed on an upper surface of the array substrate 210 or a rear surface of the opposite substrate 290. The black matrix may block a light incident thereto.

The array substrate 210 may include a pad area PA. One side of the array substrate 210 may extend in the second direction D2 more than one side of the opposite substrate 290 extends in the second direction D2, thereby providing the pad area PA. The array substrate 210 may not overlap the opposite substrate 290 in the pad area PA, and the pad area PA of the array substrate 210 may not be covered by the opposite substrate 290. A pad part extending from the fan-out part 213 may be disposed in the pad area PA. The pad part may overlap the flexible printed circuit board 120 in the pad area PA and may be electrically connected to the flexible printed circuit board 120 by an anisotropic conductive film (ACF).

In addition, a line area and a dead area may be defined on the array substrate 210. Various signal lines, e.g., the gate driving line 212, the gate lines GL1 to GLn, and the data lines DL1 to DL4m, may be disposed in the line area of the non-display area NDA and not disposed in the dead area.

Referring to FIG. 1 again, the flexible display panel 200 may have flexibility. Therefore, the flexible display panel 200 may be curved or bent by an external force applied thereto. The array substrate 210 and the opposite substrate 290 may be formed of a material having flexibility and high light transmissivity, e.g., a plastic material. The flexible display panel 200 may have a rectangular shape including first to fourth sides S1 to S4 and first to fourth corners CN1 to CN4.

The flexible display panel 200 may include first to fourth bending areas 221 to 224 bent by the external force and first to fifth non-bending areas 231 to 235 not bent.

The first to fourth non-bending areas 231 to 234 may be disposed at the first to fourth corners CN1 to CN4, respectively. The fifth non-bending area 235 may be disposed at a center of the flexible display panel 200. As an example, the fifth non-bending area 235 may have an octagonal shape when viewed in a plan view. The first to fourth non-bending areas 231 to 234 may have a triangular shape and may be disposed at positions adjacent to four inclination sides of the fifth non-bending area 235, respectively, the four inclination sides connecting the four straight sides of the fifth non-bending area 235 that are respectively located at upper, lower, left and right positions of the fifth non-bending area 235.

Here, the first direction D1 indicates a lengthwise direction of the flexible display panel 200 and the second direction D2 indicates a widthwise direction of the flexible display panel 200.

In detail, the first bending area 221 may extend in a third direction D3 inclined with respect to the first and second directions D1 and D2 and may be disposed between the first and fifth non-bending areas 231 and 235. The second bending area 222 may extend in a fourth direction D4 substantially perpendicular to the third direction D3 and may be disposed between the second and fifth non-bending areas 232 and 235. The third bending area 223 may extend in the third direction D3 and may be disposed between the third and fifth non-bending areas 233 and 235. The fourth bending area 224 may extend in the fourth direction D4 and may be disposed between the fourth and fifth non-bending areas 234 and 235.

Each of the first to fifth bending areas 221 to 224 may have a predetermined width.

The frame part 400 may be disposed along the non-display area NDA of the flexible display panel 200 to support the first to fifth non-bending areas 231 to 235. The first to fifth non-bending areas 231 to 235 are not bent. The frame part 400 may include first to fourth side frames 411 to 414 and first to fourth edge frames 421 to 424. The first to fourth side frames 411 to 414 may be disposed along the first to fourth sides S1 to S4 of the flexible display panel 200, respectively. Thus, the first to fourth side frames 411 to 414 may support the fifth non-bending area 235 to allow the fifth non-bending area 235 to not be bent.

The first edge frame 421 may be disposed in the first non-bending area 231 located at an upper right position of the flexible display panel 200 to cover an edge of the first non-bending area 231. In the present exemplary embodiment, the first edge frame 421 may have an L shape that extends in the first and second directions D1 and D2 from the first corner CN1 and may be rotated about 180 degrees in a clockwise direction. The first edge frame 421 may support the first non-bending area 231 to prevent the first non-bending area 231 from being bent. Similarly, the second to fourth edge frames 422 to 424 may be disposed at the second to fourth corners CN2 to CN4, respectively. The second to fourth edge frames 422 to 424 may respectively support the second to fourth non-bending areas 232 to 234 to prevent the second to fourth non-bending areas 232 to 234 from being bent.

The frame part 400 may not be disposed in the first to fourth bending areas 221 to 224. Each of the first to fourth edge frames 421 to 424 may be spaced apart from a corresponding side frame of the first to fourth side frames 411 to 414 by a width of a corresponding bending area of the first to fourth bending areas 221 to 224, which is disposed between a corresponding edge frame of the first to fourth edge frames 421 to 424 and a corresponding side frame of the first to fourth side frames 411 to 414. The first to fourth bending areas 221 to 224 may be bent without being disturbed or blocked by the frame part 400. The bending shape of each of the first to fourth bending areas 221 to 224 will be described in detail with reference to FIGS. 3 and 4.

Figure 3:
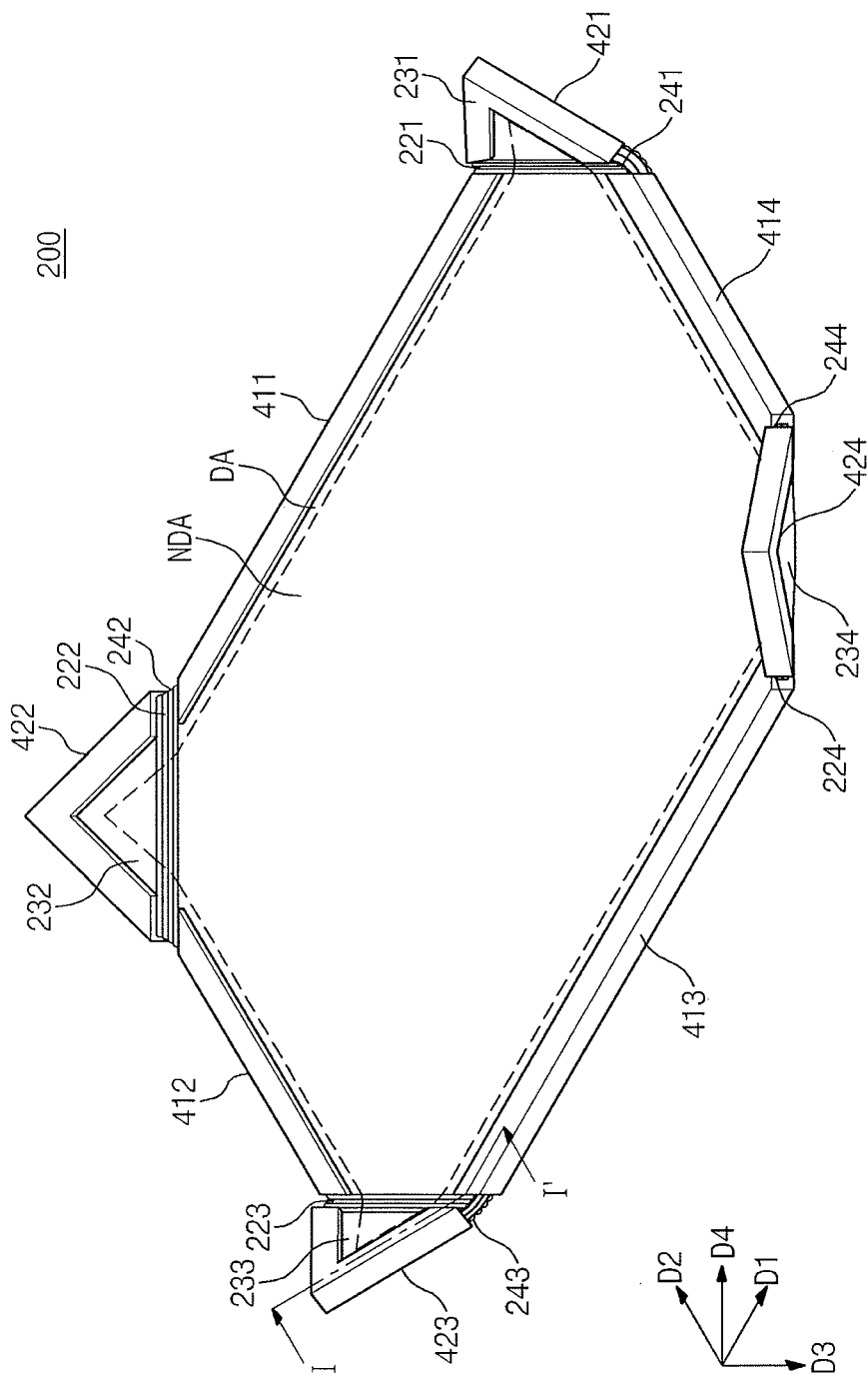
FIG. 3 illustrates a perspective view showing a flexible display in a panel partially folded state shown in FIG. 1.
Figure 4:
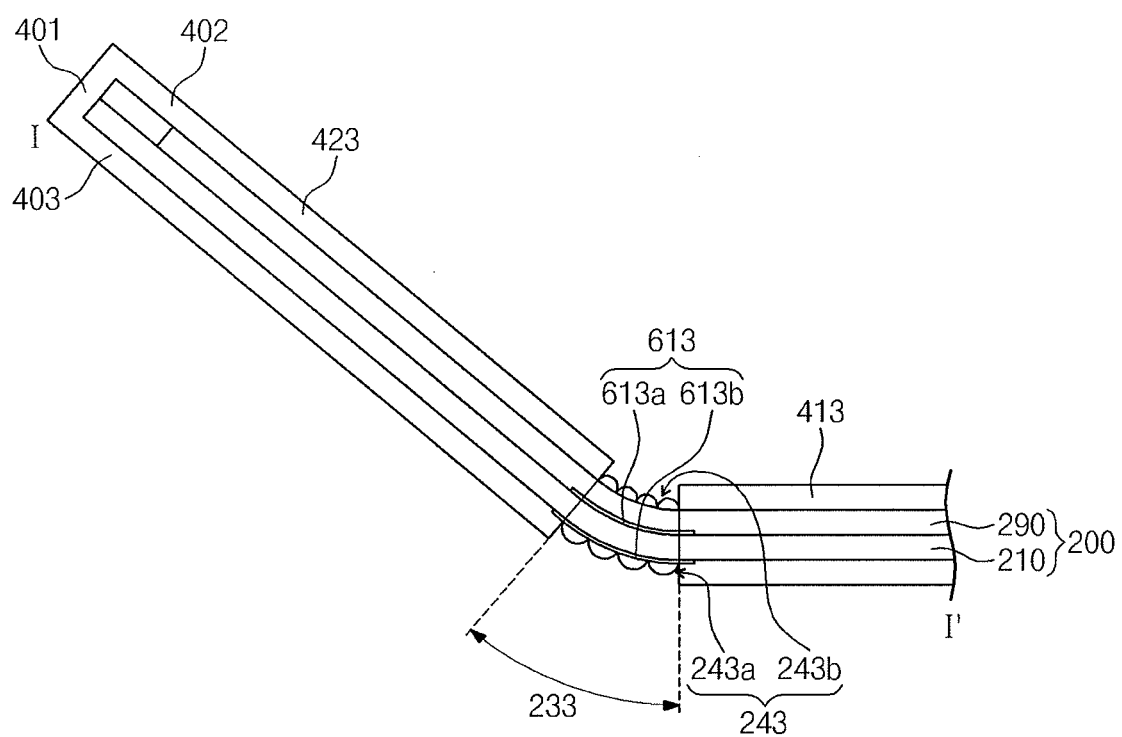
FIG. 4 illustrates a cross-sectional view taken along a line I-I' of FIG. 3.

FIG. 3 illustrates a perspective view showing a flexible display in a panel partially folded state shown in FIG. 1. FIG. 4 is a cross-sectional view taken along a line I-I' of FIG. 3. In FIGS. 3 and 4, the same reference numerals denote the same elements in FIGS. 1 and 2, and thus detailed descriptions of the same elements will not be repeated.

Referring to FIG. 3, the flexible display panel 200 may be folded along the first to fourth bending areas 221 to 224. In more detail, when the flexible display panel 200 is bent along the first bending area 221, the first non-bending area 231 may be folded upwardly to an upper portion of the fifth non-bending area 235. Similarly, when the second to fourth bending areas 222 to 224 are bent, the second to fourth non-bending areas 232 to 234 may be folded upwardly toward the upper portion of the fifth non-bending area 235. The first to fourth non-bending areas 232 to 234 may also be folded downwardly toward a rear portion of the flexible display panel 200.

The flexible display panel 200 may be inserted into the frame part 400. Each of the first to fourth side frames 411 to 414 and each of the first to fourth edge frames 421 to 424 may have a guide recess therein to accommodate the flexible display panel 200.

As shown in FIG. 4, the third edge frame 423 of the frame part 400 may include a side frame part 401 extending in a thickness direction of the flexible display panel 200, an upper frame part 402 extending from one end of the side frame part 401 to be vertical to the side frame part 401, and a lower frame part 403 extending from the other end of the side frame part 401 to be vertical to the side frame part 401. The edge of the third non-bending area 233 of the flexible display panel 200 may be inserted into the guide recess defined by the side, upper, and lower frame parts 401, 402, and 403 and coupled to the third edge frame 423.

Similarly, the flexible display panel 200 may be inserted into the guide recess of the first, second, and fourth edge frames 421, 422, and 424 and the first to fourth side frames 411 to 414 and coupled to the first, second, and fourth edge frames 421, 422, and 424 and the first to fourth side frames 411 to 414.

As described above, the flexible display panel 200 has flexibility, but the shape of each of the first to fifth non-bending areas 231 to 235 may be maintained by the frame part 400. The first to fourth bending areas 221 to 224 are not supported by the frame part 400. Accordingly, the first to fourth bending areas 221 to 224 may be bent by an external force In a general flexible display panel, an image may be distorted if a shape of the flexible display panel is curved. Accordingly, the user may have to support the flexible display panel using both hands when the user uses the flexible display panel. According to the present exemplary embodiment, however, the shape of the flexible display panel 200 may be maintained by the frame part 400. Accordingly, the user may support and use the flexible display panel 200 using only one hand. In addition, the flexible display panel 200 may be folded by the first to fourth bending areas 221 to 224. Thus the user may carry the display apparatus 1000 after the display apparatus 1000 is folded. As a result, the display apparatus may have improved convenience in use.

Referring to FIGS. 1, 3, and 4, the flexible display panel 200 may include first to fourth cover films 241 to 244. The first to fourth cover films 241 to 244 may cover the first to fourth bending areas 221 to 224, respectively. The first to fourth cover films 241 to 244 may be formed of a material with flexibility. The material used to form the first to fourth cover films 241 to 244 may have less flexibility than the flexible display panel 200. In addition, the material, thickness, and arrangement of the first to fourth cover films 241 to 244 may be determined such that the flexibility of the first to fourth bending areas 221 to 224 is controlled.

FIG. 4 illustrates a cross-sectional view of the third cover film 243. In the present exemplary embodiment, the first to fourth cover films 241 to 244 have the same structure and function, and thus only the third cover film 243 will be described in detail as a representative example.

The third cover film 243 may include an upper cover film 243b and a lower cover film 243a. The upper cover film 243b may be disposed on the upper surface of the opposite substrate 290 and the lower cover film 243a is disposed on the rear surface of the of the array substrate 210.

The third cover film 243 may have an embossed structure to effectively absorb external impacts applied thereto and relieves stress applied to the third bending area 223.

In detail, the embossed structure is formed on an upper surface of the upper cover film 243b and a rear surface of the lower cover film 243a. The embossed structure may include a plurality of protrusions protruding outwardly and extending along a direction in which the third bending area 223 extends.

As described above, in the case that the first to fourth cover films 241 to 244 cover the first to fourth bending areas 221 to 224, the flexibility of the first to fourth bending areas 221 to 224 may be controlled by the first to fourth cover films 241 to 244. In more detail, the first to fourth bending areas 221 to 224 may be bent only when an external force over a certain intensity is applied to the first to fourth bending areas 221 to 224, and thus the flexible display panel 200 may be folded when such external force is applied. When an external force less that the certain intensity is applied or when the first to fourth bending areas 221 to 224 are subject only to the force of gravity, the first to fourth bending areas 221 to 224 are not bent and the flexible display panel 200 is not folded.

Figure 5:
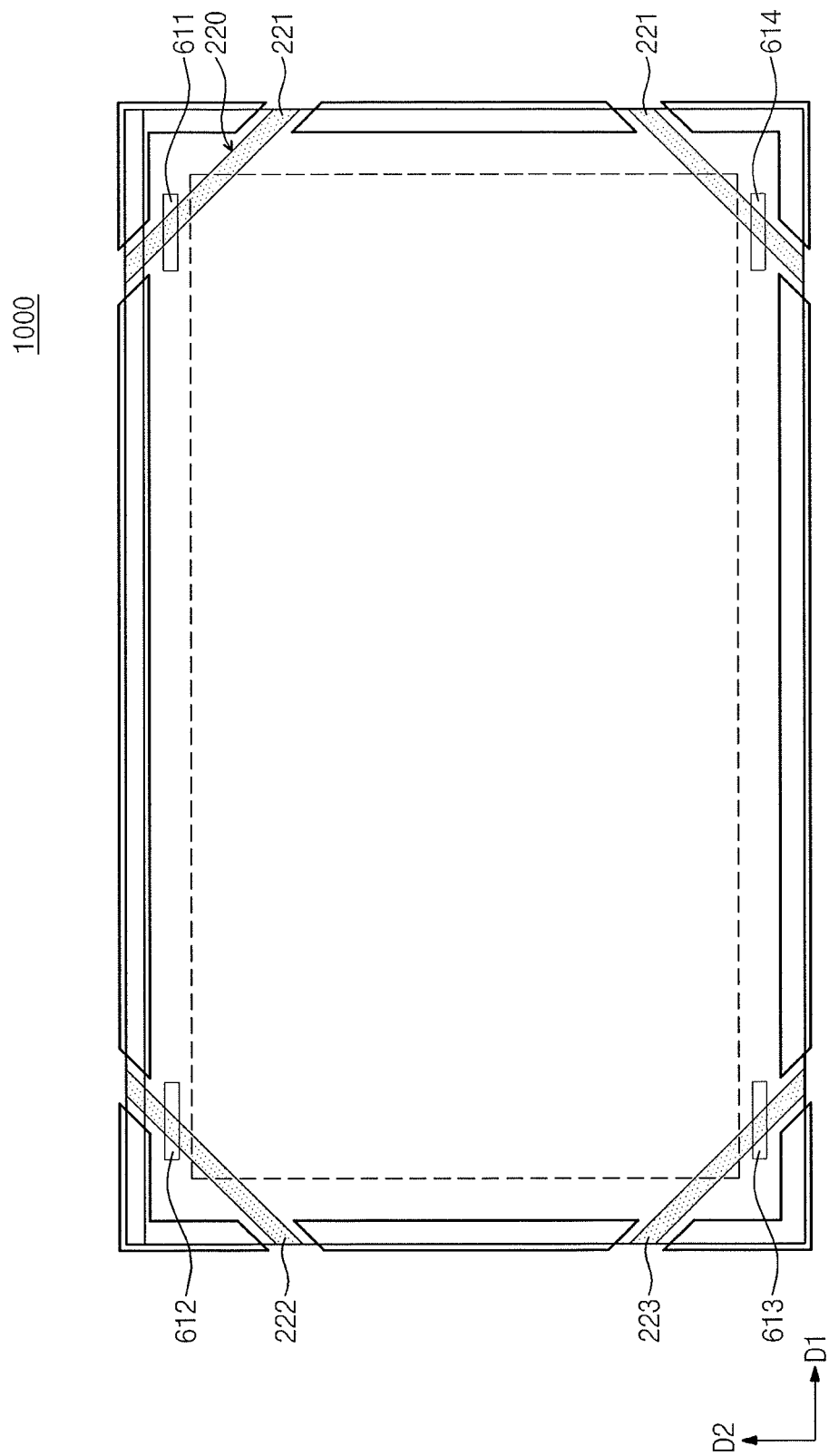
FIG. 5 illustrates a plan view showing a flexible display panel shown in FIG. 1.

FIG. 5 illustrates a plan view showing the flexible display panel shown in FIG. 1. For the convenience of explanation, FIG. 5 shows a portion of elements, which includes the first to fourth bending areas 221 to 224 and the frame part 400, of the flexible display panel 200. In FIG. 5, the same reference numerals denote the same elements in FIGS. 1 to 4, and thus detailed descriptions of the same elements will not be repeated.

Referring to FIG. 5, the display apparatus 1000 may include first to fourth sensors 611 to 614 respectively disposed in the first to fourth bending areas 221 to 224 to sense the folding of the flexible display panel 200.

The first to fourth sensors 611 to 614 may be disposed to overlap with the first to fourth bending areas 221 to 224, respectively.

The first to fourth sensors 611 to 614 may sense the folding of the flexible display panel 200. Each of the first to fourth sensors 611 to 614 may include a piezoelectric device. When a pressure is applied to the piezoelectric device, the piezoelectric device may generate current or voltage. The piezoelectric device may be formed from an artificial piezoelectric crystal, an artificial piezoelectric ceramic, a lead-free piezoelectric ceramic, a polymer, etc. When the first to fourth sensors 611 to 614 are bent in accordance with the folding of the flexible display panel 200, pressure may be applied to the first to fourth sensors 611 to 614. As a result, the first to fourth sensors 611 to 614 may generate a folding signal in current or voltage form that corresponds to the pressure applied to the first to fourth sensors 611 to 614.

FIG. 4 illustrates a cross-sectional view of the third sensor 613. In the present exemplary embodiment, the first to fourth sensors 611 to 614 have the same structure and function, and thus only the third sensor 613 will be described in detail as a representative example.

The third sensor 613 may be disposed in the third bending area 223 of the array substrate 210 and may include an upper sensor 613a and a lower sensor 613b. The upper sensor 613a may be disposed on the upper surface of the array substrate 210, and the lower sensor 613b may be disposed on the rear surface of the array substrate 210. When the third bending area 223 is bent, the upper and lower sensors 613a and 613b may be bent in accordance with the third bending area 223. As a result, the upper and lower sensors 613a and 613b may generate a folding signal in response to the pressure applied thereto.

The upper and lower sensors 613a and 613b may be disposed on the upper surface and the rear surface of the array substrate 210. Accordingly, the upper and lower sensors 613a and 613b may be subject to different pressures when the third bending area 223 is bent. The folding signal generated by the upper sensor 613a may have a level different from that of the folding signal generated by the lower sensor 613b. In this case, directions in which the third bending area 223 is bent may be easily calculated by using the folding signals having different levels that are generated by the upper and lower sensors 613a and 613b.

In the present exemplary embodiment, the upper and lower sensors 613a and 613b may be disposed on the upper surface and the rear surface of the array substrate 210, respectively In other implementations, the upper and lower sensors 613a and 613b may be respectively disposed on the upper surface of the opposite substrate 290 and the rear surface of the array substrate 210.

As described above, the first to fourth sensors 611 to 614 may generate the folding signal by taking the bending degree of the first to fourth bending areas 221 to 224 into consideration. In this case, the display apparatus 1000 may provide the user with various functions in response to the folding signal. The user may apply desired pressure to the display apparatus 1000 by bending the first to fourth bending areas 211 to 224.

Figure 6:
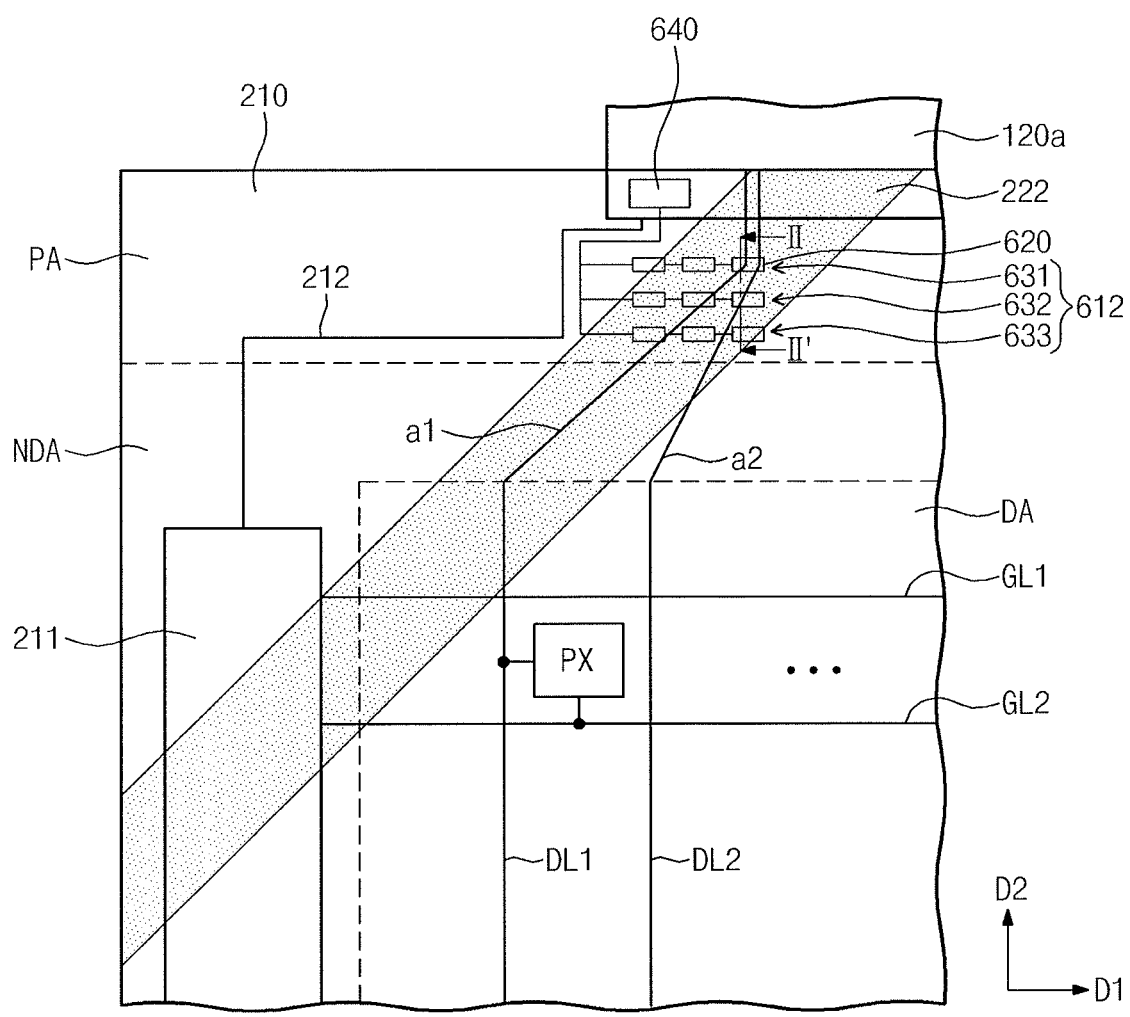
FIG. 6 illustrates a partially enlarged plan view showing an array substrate shown in FIG. 5.
Figure 7:
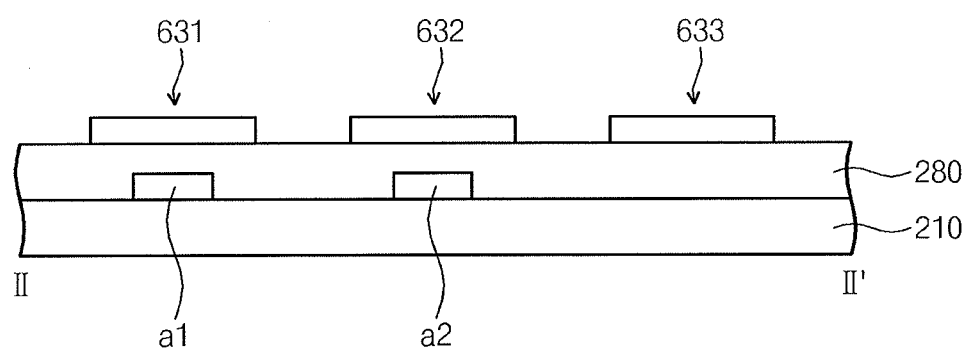
FIG. 7 illustrates a cross-sectional view taken along a line II-II' of FIG. 6.

FIG. 6 illustrates a partially enlarged plan view showing the array substrate shown in FIG. 5. FIG. 7 is a cross-sectional view taken along a line II-II' of FIG. 6. FIG. 6 shows a peripheral area of the second bending area 222. In FIGS. 6 and 7, the same reference numerals denote the same elements in FIGS. 1 to 5, and thus detailed descriptions of the same elements will not be repeated.

Referring to FIGS. 6 to 7, the array substrate 210 may include an insulating layer 280. The insulating layer 280 may be disposed on the array substrate 210 to electrically insulate the second sensor 612 from the signal lines.

The array substrate 210 may include a sensor pad 640 disposed in the pad area PA. The sensor pad 640 may disposed between the first flexible printed circuit board 120a and the pad area PA of the array substrate 210. One end of the sensor pad 640 may be electrically connected to the first flexible printed circuit board 120a by an anisotropic conductive film and the other end of the sensor pad 640 may be electrically connected to the second sensor 612.

The second sensor 612 may be disposed in the pad area PA of the array substrate 210 and may include first to third serial sensors 631 to 633. The first to third serial sensors 631 to 633 may be disposed along the first direction D1, may overlap with the second bending area 222, and may be arranged in the second direction D2 to be spaced apart from each other by a predetermined distance. The first to third serial sensors 631 to 633 may be connected to each other in parallel. When the first to third serial sensors 631 to 633 are connected to each other in parallel, currents of the folding signal generated from the first to third serial sensors 631 to 633 may be summed together. Accordingly, the current value of the folding signal generated from the second sensor 612 may be increased, and thus, the bending degree of the second bending area 222 may be effectively measured using the current value.

The first serial sensor 631 may include a plurality of sensors 620 connected in series. Each sensor 620 may be the piezoelectric device. Each of the second to fourth serial sensors 632 to 634 includes a plurality of sensors 620 connected to each other in series. When the sensors 620 are connected in series, voltage values of the folding signal generated from each sensor 620 are added to one another. Therefore, the voltage value of the folding signal generated from each sensor 620 may be increased, and thus, the bending degree of the second bending area 222 may be effectively measured using the increased voltage value.

The second sensor 612 may be disposed on the line area of the pad area PA to overlap with the signal lines. The first and second serial sensors 631 and 632 may overlap with a portion of the first and second fan-out lines a1 and a2.

The array substrate 210 may further include the insulating layer 280. The insulating layer 280 may be disposed between the array substrate 210 and the first to fourth sensors 611 to 614 to electrically insulate the first to fourth sensors 611 to 614 from the array substrate 210.

The insulating layer 280 may be disposed between the portion of the first fan-out lines a1 and a2 and the first and second serial sensors 631 and 632. Thus the first and second serial sensors 631 and 632 are electrically insulated from the first fan-out lines a1 and a2.

As described above, the second sensor 612 may be disposed to overlap with the line area of the array substrate 210. Accordingly, the flexible display panel 200 need not have a separate area for the arrangement of the first to fourth sensors 611 to 614. The size of the non-display area NDA may be maintained regardless of the arrangement of the first to fourth sensors 611 to 614.

In the present exemplary embodiment, the first to fourth sensors 611 to 614 may be disposed in the pad area PA. In other implementations, in a case that the black matrix area is overlapped with the first to fourth bending areas 221 to 224, the first to fourth sensors 611 to 614 may be arranged in the black matrix area.

Figure 8:
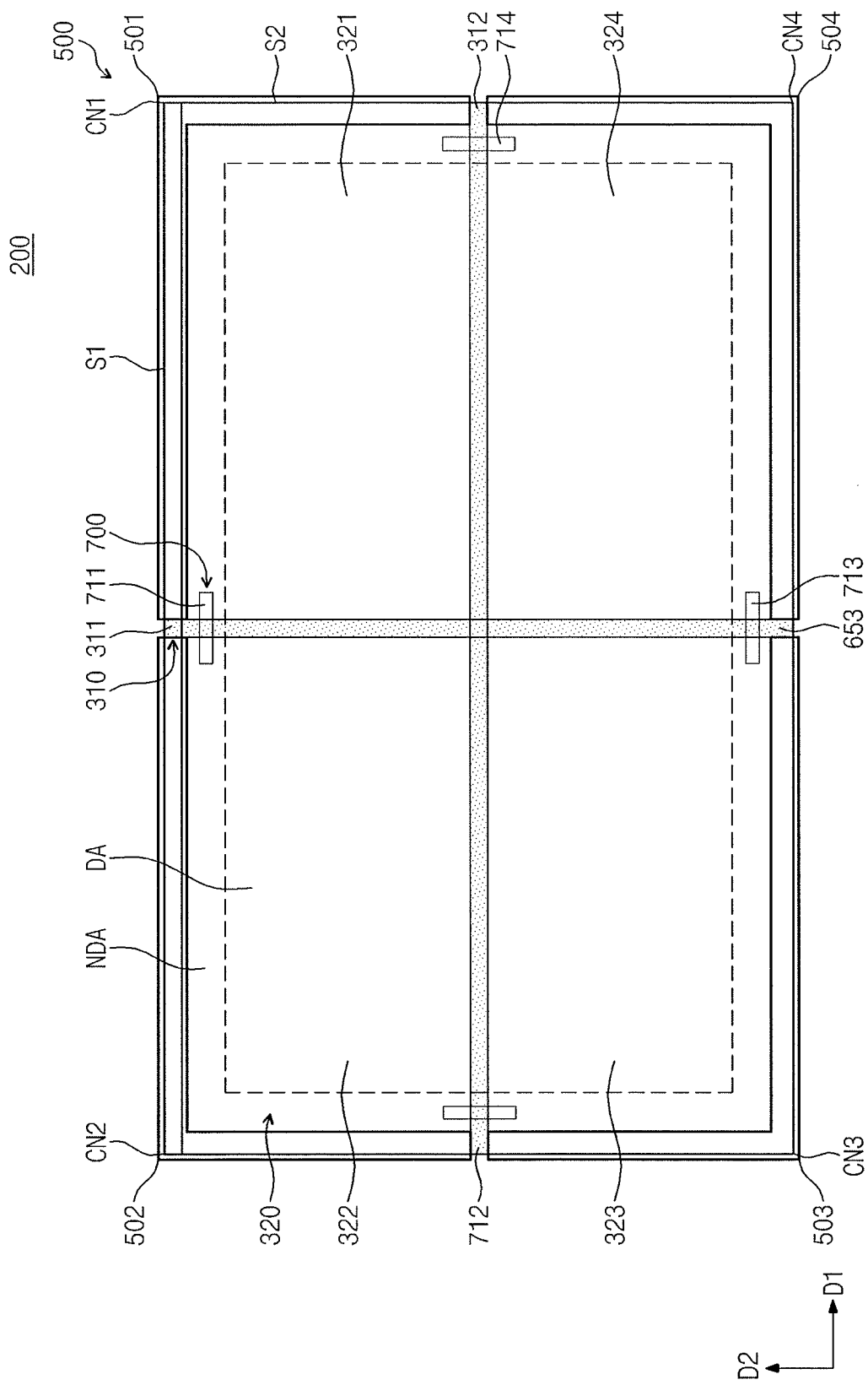
FIG. 8 illustrates a plan view showing a flexible display panel according to another exemplary embodiment.

FIG. 8 illustrates a plan view showing a flexible display panel according to another exemplary embodiment. In FIG. 8, the same reference numerals denote the same elements in FIGS. 1 to 5, and thus detailed descriptions of the same elements will be omitted.

Referring to FIG. 8, a flexible display panel 200 may include first and second bending areas 311 and 312 that are bendable by an external force, first to fourth non-bending areas 321 to 324, a frame part 500, and first to fourth sensors 711 to 714.

The first bending area 311 may extend in a second direction D2 and the second bending area 312 may extend in a first direction D1. Here, the first direction D1 indicates a lengthwise direction of the flexible display panel 200 and the second direction D2 indicates a widthwise direction of the flexible display panel 200.

Each of the first to fourth non-bending areas 321 to 324 may have a rectangular shape. The first to fourth non-bending areas 321 to 324 may be separated from each other by the first and second bending areas 311 and 312. The first to fourth non-bending areas 321 to 324 may be arranged on the flexible display panel 200 in a matrix form to divide the flexible display panel 200 into quarter sections arranged in the first and second directions D1 and D2. The first, second, third, and fourth non-bending areas 321 to 324 may be disposed at an upper right portion, an upper left portion, a lower left portion, and a lower right portion, respectively.

The first bending area 311 may be disposed between the first and second non-bending areas 321 and 322 and between the third and fourth non-bending areas 323 and 324, The flexible display panel 200 may be folded in the first direction D1 along the first bending area 321. The second bending area 312 may be disposed between the first and fourth non-bending areas 321 and 324 and between the second and third non-bending areas 322 and 323, such that the flexible display panel 200 may be folded in the second direction D2 along the second bending areas 312.

The frame part 500 may be disposed along the non-display area NDA of the flexible display panel 200 and may support the flexible display panel 200 to prevent first to fourth non-bending areas 321 to 324 from being bent. The frame part 500 may include first to fourth frame parts 501 to 504. The first frame part 501 may have an L shape extending from the first corner CN1 along the first and fourth sides S1 and S4 and being rotated about 180 degrees. The first frame part 501 supports the first non-bending area 321, and thus the first non-bending area 321 may not be bent. Similarly, the second to fourth frame parts 502 to 504 may be respectively disposed at the second to fourth corners CN2 to CN4 to support the second to fourth non-bending areas 322 to 324. Therefore, the second to fourth non-bending areas 322 to 324 may not be bent.

The frame part 500 is not disposed in the first and second bending areas 311 and 312 and the first to fourth frame parts 501 to 504 may be spaced apart from each other by a width of the first and second bending areas 311 and 312 disposed between the first to fourth non-bending areas 501 to 504. Therefore, the first and second bending areas 311 and 312 may be bent without being disturbed or blocked by the frame part 500.

As described above, the shape of the flexible display panel 200 may be maintained by the frame part 500. Accordingly, the user may support and use the display apparatus using only one hand. In addition, the flexible display panel 200 may be folded at the first and second bending areas 311 and 312. Thus the user may carry the display apparatus while the display apparatus is folded. As a result, the display apparatus may have improved convenience in use.

The first to fourth sensors 711 to 714 may be disposed at the first and second bending areas 311 and 312 of the non-display area NDA to sense the folding of the flexible display panel 200. The first and third sensors 711 to 713 may extend in the first direction D1 and may be disposed to overlap with the first bending area 311. The second and fourth sensors 712 and 714 may extend in the second direction D2 and may be disposed to overlap with the second bending area 312.

The first to fourth sensors 711 to 714 may sense the folding of the flexible display panel 200. In detail, when the first to fourth sensors 711 to 714 are folded in accordance with the folding of the flexible display panel 200, pressure may be applied to the first to fourth sensors 711 to 714. As a result, the first to fourth sensors 711 to 714 may generate a folding signal in current or voltage form in response to the pressure applied to the first to fourth sensors 711 to 714.

The display apparatus may provide the user with various functions in response to the folding signal. The user may apply desired pressure to the display apparatus by bending the first and second bending areas 311 and 312.

Figure 9:
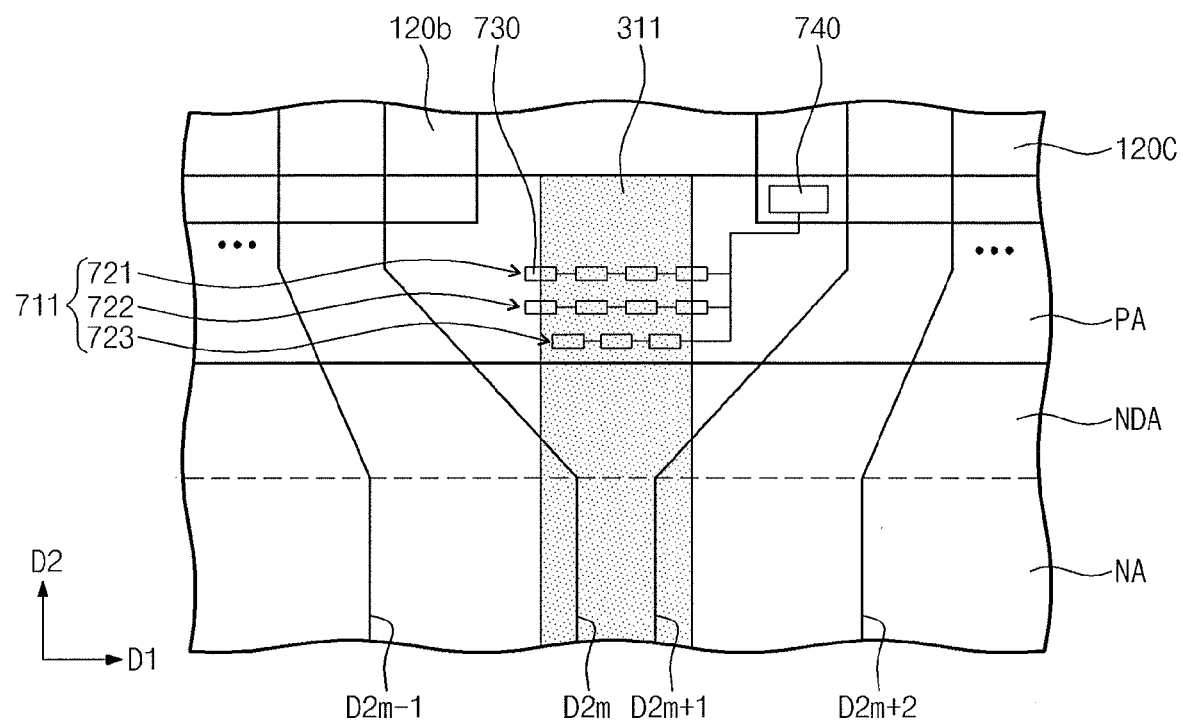
FIG. 9 illustrates a partially enlarged plan view showing an array substrate shown in FIG. 8.

FIG. 9 illustrates a partially enlarged plan view showing the array substrate shown in FIG. 8. In FIG. 9, the same reference numerals denote the same elements in FIGS. 1 to 8, and thus detailed descriptions of the same elements will not be repeated.

Referring to FIG. 9, the array substrate 210 may include a sensor pad 740 disposed in the pad area PA. The sensor pad 740 may be interposed between the third flexible printed circuit board 120c and the pad area PA of the array substrate 210. One end of the sensor pad 740 may be electrically connected to the third flexible printed circuit board 120c by an anisotropic conductive film and the other end of the sensor pad 740 is electrically connected to the first sensor 711.

The first sensor 711 may be disposed in the pad area PA of the array substrate 210 and may include first to third serial sensors 721 and 723. The first to third serial sensors 721 to 723 may extend in the first direction D1 to overlap with the first bending area 311 and may be arranged in the second direction D2 to be spaced apart from each other by a predetermined distance. The first to third serial sensors 721 and 723 may be connected to each other in parallel.

The first serial sensor 721 may include a plurality of sensors 730 connected to each other in series. Each sensor 730 may be a piezoelectric device. Similarly, each of the second and third serial sensors 722 and 723 may include a plurality of sensors 730 connected to each other in series.

The first sensor 711 may be disposed in a dead area of the array substrate 210. Thus, the first sensor 711 may not overlap the signal lines. The first sensor 711 may be disposed between the second and third fan-out parts 213b and 213c.

As described above, the first to fourth sensors 711 to 714 may be disposed in a dead area of the array substrate 210. Accordingly, the flexible display panel 210 need not have a separate area for the arrangement of the first to fourth sensors 711 to 714. The size of the non-display area NDA may be maintained regardless of the arrangement of the first to fourth sensors 711 to 714.

In FIGS. 1 to 9, the flexible display panel is shown as having a rectangular shape. In other implementations, the flexible display panel may have other shapes.

Figure 10A:
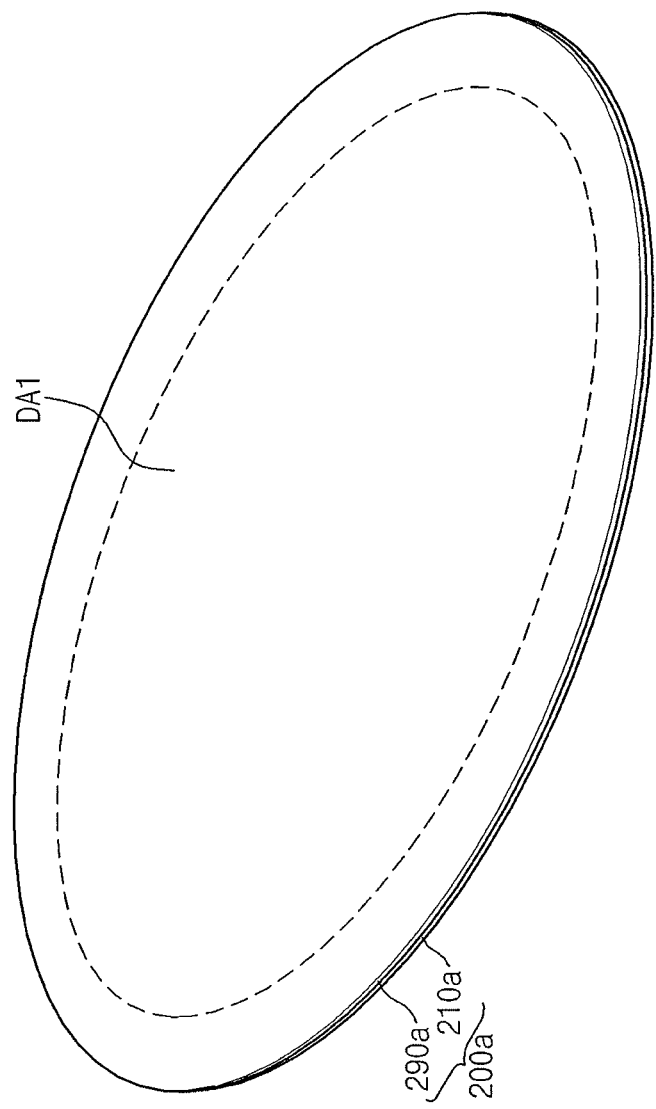
FIGS. 10A and 10B illustrate perspective views showing flexible display panels according to another exemplary embodiment.
Figure 10B:
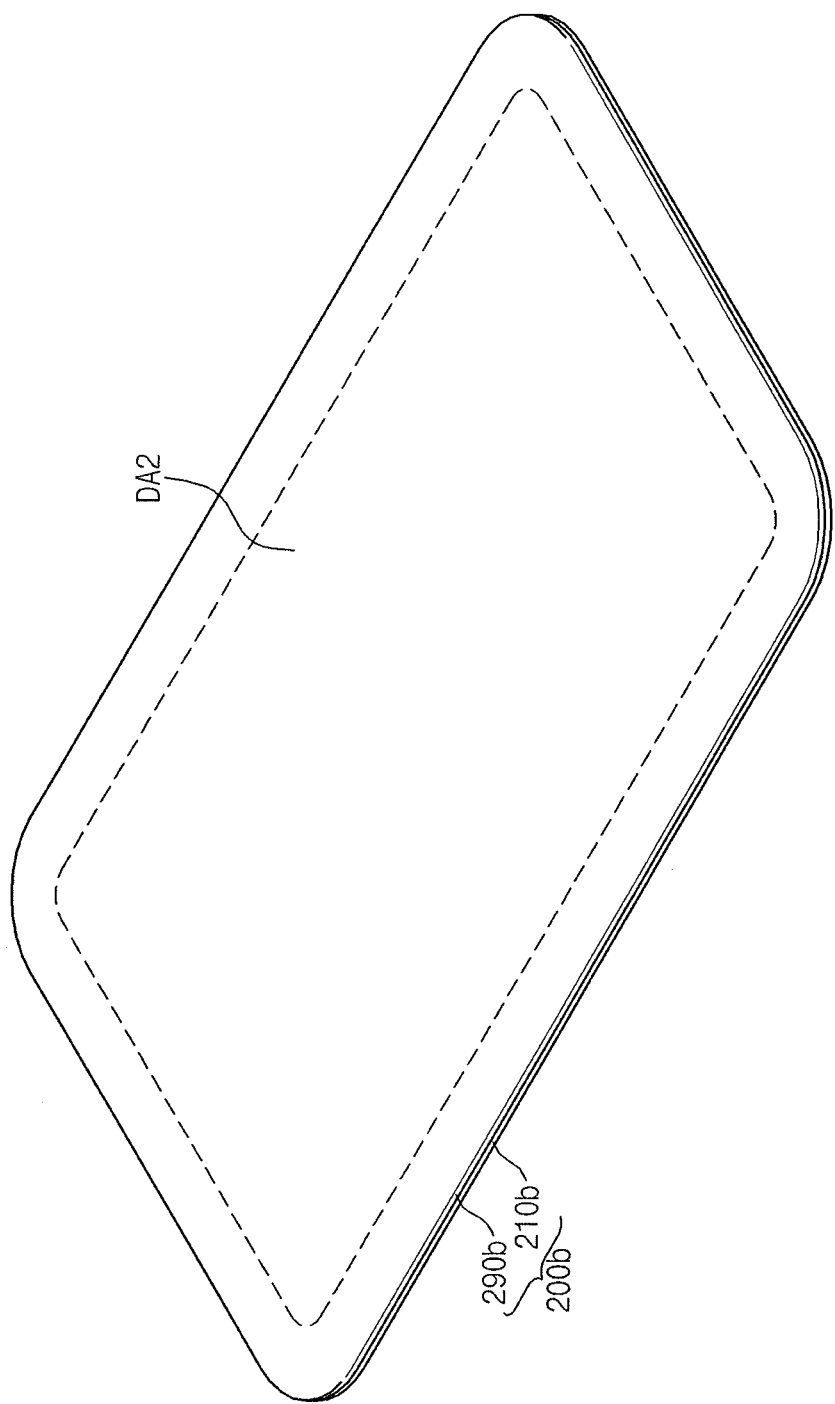

FIGS. 10A and 10B illustrate perspective views showing flexible display panels according to other exemplary embodiments.

Referring to FIG. 10A, the flexible display panel 200a may have an oval shape. In this case, an array substrate 210a, an opposite substrate 290a, and a display area DA1 may have an oval shape. As another example, a flexible display panel 200b may have a shape in which each corner of the flexible display panel is rounded as shown in FIG. 10B. In this case, each corner of an array substrate 210b, an opposite substrate 290b, and a display area DA2 may be rounded. In each case, the flexible display panels 200a and 200b may be provided with bending parts and non-bending parts. A display apparatus including one of the flexible display panels 200a or 200b may include a frame part and a sensor as described above.

By way of summation and review, a foldable display apparatus that is folded for the user's convenience of moving or handling and that unfolded when the user desires to use it has been developed. Embodiments provide a foldable display apparatus that is convenient to use. According to embodiments, the display apparatus includes a sensor that senses the folding of the flexible display panel. Thus, a user can provide an input signal to the display apparatus by folding the flexible display panel.

According to embodiments, the frame part maintains the shape of the flexible display panel. Thus the image displayed through the flexible display panel may be prevented from being distorted even though the flexible display panel is bendable. Thus, the display apparatus may have improved convenience in use.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A display apparatus, comprising:
a flexible display panel including a plurality of non-bending areas and a bending area between the non-bending areas, the flexible display panel being foldable along the bending area;
a frame part in the non-bending areas of the flexible display panel and supporting the non-bending areas to prevent the non-bending areas from being bent; and
a sensor in the bending area to sense folding of the flexible display panel.

2. The display apparatus as claimed in claim 1, wherein:
the flexible display panel further includes a display area in which an image is displayed and a non-display area surrounding the display area, and
the frame part is located along the non-display area.

3. The display apparatus as claimed in claim 2, wherein the sensor is on an upper surface and a rear surface of the flexible display panel.

4. The display apparatus as claimed in claim 2, wherein:
the flexible display panel further includes an array substrate and an opposite substrate facing the array substrate, and
the sensor is on an upper surface and on a rear surface of the array substrate.

5. The display apparatus as claimed in claim 2, wherein the flexible display panel further includes a cover film that covers the bending area of the non-display area.

6. The display apparatus as claimed in claim 5, wherein an outer surface of the cover film has an embossed structure.

7. The display apparatus as claimed in claim 2, wherein:
the non-display area includes a line area in which a signal line is located and a dead area in which the signal lines is not located, and
the sensor is located inn the dead area.

8. The display apparatus as claimed in claim 7, wherein:
the signal line further includes:
a plurality of data lines; and
a plurality of fan-out parts in the line area, the fan-out parts being connected to the data lines, and
the sensor is between the fan-out parts.

9. The display apparatus as claimed in claim 7, wherein the flexible display panel further includes an insulating layer on the line area and between the sensor and the signal line.

10. The display apparatus as claimed in claim 2, wherein the flexible display panel further includes:
a black matrix area defined in the non-display area and surrounding the display area; and
a black matrix in the black matrix area, the sensor overlapping black matrix.

11. The display apparatus as claimed in claim 2, wherein:
the flexible display panel further includes an array substrate and an opposite substrate facing the array substrate,
the non-display area includes a pad area obtained by extending the array substrate in one direction thereof more than the opposite substrate,
the array substrate does not overlap the opposite substrate in the pad area, and
the sensor is disposed in the pad area.

12. The display apparatus as claimed in claim 11, wherein:
the array substrate includes a sensor pad at an end portion of the pad area, and
the sensor is electrically connected to the sensor pad.

13. The display apparatus as claimed in claim 12, further comprising:
a flexible printed circuit board on the sensor pad; and
an anisotropic conductive film between the sensor pad and the flexible printed circuit board, wherein the sensor pad is connected to the flexible printed circuit board through the anisotropic conductive film.

14. The display apparatus as claimed in claim 1, wherein the sensor includes a serial sensor that includes a plurality of sensors connected to each other in series.

15. The display apparatus as claimed in claim 14, wherein:
the serial sensor as provided in a plural number of serial sensors, and
the serial sensors are connected to each other in parallel.

16. The display apparatus as claimed in claim 1, wherein:
the flexible display panel has a rectangular shape and includes first, second, third, and fourth corners,
the bending area includes first, second, third, and fourth bending areas that are inclined to a lengthwise direction and a widthwise direction of the flexible display panel and that extend in different directions from each other,
the first bending area is located at the first corner such that the flexible display panel is foldable along the first bending area at the first corner,
the second bending area is located at the second corner such that the flexible display panel is foldable along the second bending area at the second corner,
the third bending area is located at the third corner such that the flexible display panel is foldable along the third bending area at the third corner, and
the fourth bending area is located at the fourth corner such that the flexible display panel is foldable along the fourth bending area at the fourth corner.

17. The display apparatus as claimed in claim 1, wherein the bending area extends in a lengthwise direction of the flexible display panel such that the flexible display panel is foldable in a widthwise direction of the flexible display panel.

18. The display apparatus as claimed in claim 1, wherein the bending area extends in a widthwise direction of the flexible display panel such that the flexible display panel is foldable to a lengthwise direction of the flexible display panel.

19. The display apparatus as claimed in claim 1, wherein the sensor is a piezoelectric device.

20. The display apparatus as claimed in claim 1, wherein the flexible display panel is a liquid crystal display panel or an organic light emitting display panel.

* * * * *